(12) United States Patent
Nazarovs et al.

(10) Patent No.: US 9,650,585 B2
(45) Date of Patent: May 16, 2017

(54) NANOCOMPOSITE SOLID LUBRICANT COATING

(71) Applicant: Naco Technologies, SIA, Rīga (LV)

(72) Inventors: Pavels Nazarovs, Rīga (LV); Valery Mitin, Rīga (LV); Vladimirs Kovalenko, Rīga (LV)

(73) Assignee: NACO TECHNOLOGIES, SIA, Riga (LV)

( * ) Notice: Subject to any disclaimer, the term of this patent is extended or adjusted under 35 U.S.C. 154(b) by 255 days.

(21) Appl. No.: 14/824,037

(22) Filed: Aug. 11, 2015

(65) Prior Publication Data

US 2016/0230110 A1 Aug. 11, 2016

(30) Foreign Application Priority Data

Feb. 6, 2015 (EP) .................................... 15154160

(51) Int. Cl.
*C10M 103/00* (2006.01)
*C10M 103/02* (2006.01)
(Continued)

(52) U.S. Cl.
CPC ........... *C10M 103/02* (2013.01); *B82Y 30/00* (2013.01); *C09D 5/00* (2013.01); *C10M 103/00* (2013.01);
(Continued)

(58) Field of Classification Search
CPC C10M 103/00; C10M 103/02; C10M 103/04; C09D 5/00; C23C 14/35; C23C 14/14; C22C 9/00
See application file for complete search history.

(56) References Cited

U.S. PATENT DOCUMENTS

| | | |
|---|---|---|
| 5,087,529 A | 2/1992 | Engel et al. |
| 2005/0214591 A1 | 9/2005 | Maeda et al. |

(Continued)

FOREIGN PATENT DOCUMENTS

| | | |
|---|---|---|
| CN | 101214539 A * | 7/2008 |
| GB | 2052168 | 2/1984 |

(Continued)

OTHER PUBLICATIONS

Co-sputtering C—Cu thin film synthesis: microstructural study of copper precipitates encapsulated into a carbon matrix, T.Cabioch et al, Phil. Mag. B 79 (1999) 501-516.

(Continued)

*Primary Examiner* — Taiwo Oladapo
(74) *Attorney, Agent, or Firm* — Smartpat PLC

(57) ABSTRACT

A solid lubricant magnetron sputtering physical vapor deposition (MS PVD) coating can be used e.g. in automotive, aircraft and space industries for increasing lifetime of moving parts such as bearings, chains, pistons and joints that experience sliding or rolling friction. A nanocomposite solid lubricant coating contains a carbon matrix with copper grains and at least one of Ti, Zr, Hf, and V, in bulk proportions, at. %:

| | |
|---|---|
| carbon | 5-35; |
| copper | 50-90; |
| additional metal | 5-15. |

The carbon matrix with copper grains is reinforced with interlayers of the additional metal. The thickness of each layer of the carbon matrix with copper grains is in the range between 30 and 150 nanometers and the thickness of each interlayer of the additional metal is in the range between 5 and 20 nanometers. The hardness of said coating is in the range between 200 and 1000 HV.

5 Claims, 2 Drawing Sheets

(51) Int. Cl.
| | |
|---|---|
| C23C 14/35 | (2006.01) |
| C23C 14/14 | (2006.01) |
| C22C 9/00 | (2006.01) |
| C10M 103/04 | (2006.01) |
| C09D 5/00 | (2006.01) |
| B82Y 30/00 | (2011.01) |
| C23C 28/00 | (2006.01) |

(52) U.S. Cl.
CPC ............ *C10M 103/04* (2013.01); *C22C 9/00* (2013.01); *C23C 14/14* (2013.01); *C23C 14/35* (2013.01); *C23C 28/322* (2013.01); *C23C 28/343* (2013.01); *C23C 28/42* (2013.01)

(56) References Cited

U.S. PATENT DOCUMENTS

| | | |
|---|---|---|
| 2006/0284169 A1 | 12/2006 | Park et al. |
| 2009/0155479 A1* | 6/2009 | Xiao ................. C23C 4/06 427/451 |
| 2012/0077017 A1 | 3/2012 | Buresch et al. |
| 2013/0085088 A1 | 4/2013 | Erdemir et al. |
| 2013/0086881 A1 | 4/2013 | Joergensen et al. |

FOREIGN PATENT DOCUMENTS

| | | | |
|---|---|---|---|
| KR | WO 02076677 A1 * | 10/2002 | ............ B24D 3/06 |
| SU | 1694550 A1 * | 11/1991 | |
| WO | 2012078151 A1 | 6/2012 | |

OTHER PUBLICATIONS

Phase composition and tribological properties of copper/carbon composite films, W.Gulbinski et al., Surf. & Coat. Tech. 200 (2005) 2146-2151.

Relationship between mechanical properties and coefficient of friction of sputtered a-C/Cu composite thin films, J. Musil et al., Diam. & Rel. Mat. 17 (2008) 1905-1911.

Surface Coatings for Protection Against Wear, B.G.Mellor, Woodhead Publishing Limited, 2006.

* cited by examiner

NANOCOMPOSITE SOLID LUBRICANT COATING

RELATED APPLICATION

This application claims foreign priority of European Patent Application No. 15154160, filed Feb. 6, 2015, which is incorporated by reference in its entirety

TECHNICAL FIELD

The invention relates to a solid lubricant magnetron sputtering physical vapor deposition (MS PVD) nanocomposite coating, which can be used in mechanical engineering, specifically in automotive, aircraft and space industries for increasing lifetime of moving parts such as bearings, chains, pistons and joints that experience sliding or rolling friction.

BACKGROUND

Usually hard physical vapor deposition (PVD) coatings such as nitrides, carbides or diamond-like coatings with hardness of 2000 HV and higher are used for increasing lifetime of moving parts as is shown in WO 2012/078151, US 2013/0086881, US 2013/0085088. While hard coatings protect a surface and increase its lifetime, they decrease the fatigue strength and increase the wear rate of a counterpart. Also, while degrading, the fractured parts of the hard coating become abrasive and hasten degradation ["Surface Coatings for Protection Against Wear", B. G. Mellor, Woodhead Publishing Limited, 2006].

Solid lubricant films can be used as an alternative to the hard coatings. In the last years, the main attention was paid to a group of nanocomposites consisting of an amorphous carbon and various metals (Ti, Ta, Zr, Au, Cu, Ag, etc.) ["Relationship between mechanical properties and coefficient of friction of sputtered a-C/Cu composite thin films", J. Musil et al., Diam. & Rel. Mat. 17 (2008) 1905-1911]. A copper-carbon nanocomposite coating exhibits high plasticity, low friction, high adhesive and cohesive properties and it attracts particular attention due to its low cost ["Phase composition and tribological properties of copper/carbon composite films", W. Gulbinski et al., Surf. & Coat. Tech. 200 (2005) 2146-2151]. Copper-carbon nanocomposite possesses sponge-like developed structure consisting of copper precipitates encapsulated in a carbon matrix ["Co-sputtering C—Cu thin film synthesis: microstructural study of copper precipitates encapsulated into a carbon matrix", T. Cabioch et al, Phil. Mag. B 79 (1999) 501-516]. The result is that such a coating exhibits good tribological properties and greatly increases the lifetime of the surfaces that experience sliding or rolling friction. The main disadvantage of a pure copper-carbon nanocomposite coating is its low hardness, which leads to a high wear rate and makes it insufficient for applications under heavy loads.

SUMMARY

A technical problem to be solved by the present invention is to adapt the MS PVD copper-carbon nanocomposite coating for application in mechanical engineering as a solid lubricant coating by increasing its hardness and decreasing its wear rate.
A nanocomposite solid lubricant coating containing a carbon matrix with copper grains, according to the present invention, contains an additional metal selected from the group consisting of Ti, Zr, Hf, V, in bulk proportions, at. %:

| | |
|---|---|
| carbon | 5-35; |
| copper | 50-90; |
| additional metal | 5-15; | the carbon matrix with copper grains is reinforced with interlayers of the additional metal;
the thickness of each layer of the carbon matrix with copper grains is in the range between 30 and 150 nanometers and the thickness of each interlayer of the additional metal is in the range between 5 and 20 nanometers;
the hardness of said coating is in the range between 200 and 1000 HV.

It was experimentally determined that the nanocomposite solid lubricant coating with the mentioned bulk proportions of the ingredients presents the optimal combination of parameters such as friction coefficient, wear rate, cohesion, adhesion and internal stresses. Cohesion of the coating sufficiently decreases when the carbon bulk concentration in the coating exceeds 35 at. %. Copper concentration higher than 90 at. % leads to a lower hardness and a higher friction coefficient. The friction coefficient sufficiently increases also when the additional metal bulk concentration in the coating exceeds 15 at. % or the carbon bulk concentration is lower than 5 at. %. A notable decline in wear rate is observed when the additional metal concentration in the coating exceeds 5 at. %.

Pure copper-carbon nanocomposite has low hardness and fails under heavy loads. The introduction of the interlayers of the additional metal significantly increases the hardness of the nanocomposite solid lubricant and decreases its wear rate.

The introduction of thicker interlayers of the additional metal leads to a higher friction coefficient. The copper-carbon layers thicker than 150 nm result in lower hardness and wear resistance, the copper-carbon layers thinner than 30 nm result in a higher friction coefficient.

The size of copper grains is in the range between 20 and 100 nm, which are wrapped in carbon matrix nanolayers with the thickness in the range between 1 and 10 nm. The size of said copper grains can be controlled through the copper-carbon target's power density. If the copper grain size is larger than 100 nm, it leads to a higher friction coefficient. If the carbon nanolayers are thicker than 10 nm, it leads to a lower cohesion in the coating.

The resulting hardness of the coating mostly depends on the bulk proportion of the elements and the thickness of the interlayer of the additional metal. The coating with hardness lower than 200 HV is insufficient for applications under heavy loads. Hardness higher than 1000 HV indicates high internal stresses and decreases the adhesion and plasticity of the coating and fatigue strength of the coated surface.

The thickness of the nanocomposite solid lubricant coating is preferably in the range between 2.5 and 150 micrometers. The coating with the thickness less than 2.5 micrometers shows no significant changes in the tribological properties of the coated surface. Increasing the coating thickness to above 150 micrometers results in lower cohesion.

More preferably, the thickness of the solid lubricant is in the range between 5 and 15 micrometers. It was experimentally determined that the nanocomposite solid lubricant coating with the thickness in said range presents the optimal combination of parameters such as friction coefficient, wear rate, cohesion, adhesion and internal stresses.

The proposed nanocomposite solid lubricant coating may be produced by a method of magnetron sputtering physical vapor deposition (MS PVD) using at least one copper-carbon mosaic target and at least one additional metal target consecutively with the power density of the copper-carbon mosaic target exceeding 40 W/cm2. Such high power density gives the possibility of equalization of the sputtering rates of different materials such as copper and carbon, and is necessary for producing copper/carbon layers with desired structure and properties. It was experimentally determined that the resulting bulk proportions of copper and carbon in the coating are the same as surface area proportions of copper and carbon in the erosion zone of the mosaic target. The use of the mosaic targets leads to the higher sputtering rate of carbon due to Cu atoms implantation into graphite, which results in a higher manufacturing rate and lower cost.

DETAILED DESCRIPTION

The invention will now be described by way of examples.

Example 1

Gearwheels were placed in a vacuum chamber with two-fold rotation with four copper-carbon mosaic targets (with 14% carbon surface area) and two zirconium targets. The gearwheels were coated by MS PVD method at argon (99.999%) pressure of 2.8 mTorr for 40 minutes at a substrate-target distance of 40-60 mm with an 11 micrometers thick nanocomposite solid lubricant coating. The bias voltage of −100V was used during the deposition process. The power density of the copper-carbon mosaic target was 115 W/cm$^2$ and the power density of zirconium target was 60 W/cm$^2$. The bulk proportions of the elements were in the coating, at. % (excluding oxygen trapped from the environment on the surface of the coating after deposition):

| | |
|---|---|
| carbon | 14; |
| copper | 80; |
| additional metal (zirconium) | 6. |

The nanocomposite solid lubricant coating consisted of the alternating layers of zirconium and carbon matrix with copper grains. The investigation of the cross sectional Scanning electron microscopy (SEM) image of the coating showed that the thickness of each zirconium layer was in the range between 5 and 10 nm and the thickness of each copper-carbon layer—in the range between 80 and 90 nm. The gearwheels were coated with the nanocomposite solid lubricant coating, which showed HF2 adhesion, the hardness of 700 HV, the wear rate lower than $10^{-16}$ m$^3$/N·m, the friction coefficient of 0.21 in dry conditions and 0.07 in an oil environment.

Figure 1:
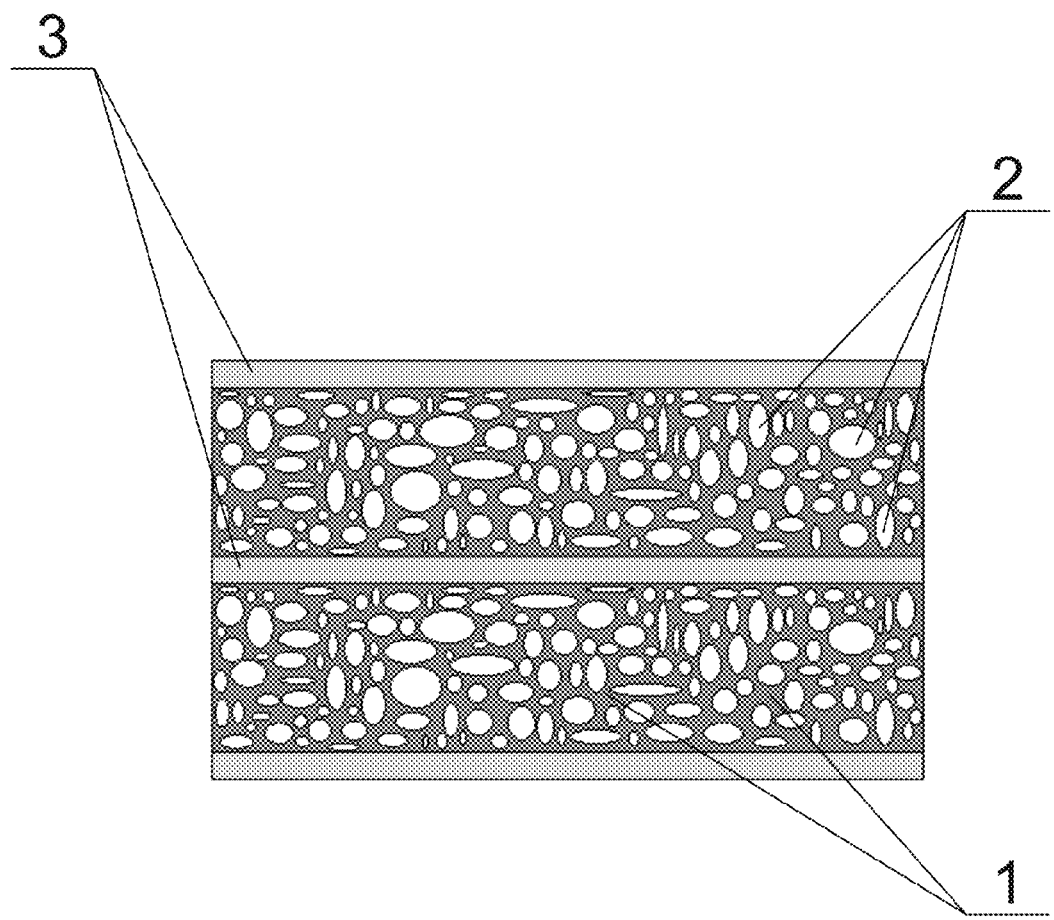
FIG. 1—greatly schematized sketch of the layers of the nanocomposite solid lubricant coating.

The layers of the nanocomposite solid lubricant coating are schematically shown on the sketch (FIG. 1), where carbon matrix 1 with copper grains 2 is reinforced with interlayers 3 of the additional metal.

Example 2

100Cr6 shims were coated by MS PVD method at argon (99.999%) pressure of 3.0 mTorr for 70 minutes at a substrate-target distance of 30-40 mm using two copper-carbon mosaic targets (with 26% carbon surface area) and one titanium target. The resulting nanocomposite solid lubricant coating was 10 micrometers thick with the copper grain size varying from 40 to 80 nm. The bias voltage of −100V was used during the deposition process. The power density of the copper-carbon mosaic target was 100 W/cm$^2$ and the power density of the titanium target was 60 W/cm$^2$. The deposited nanocomposite solid lubricant coating contained in bulk proportions, at. % (excluding oxygen trapped from the environment on the surface of the coating after deposition):

| | |
|---|---|
| carbon | 23; |
| copper | 67; |
| additional metal (titanium) | 10. |

Figure 2:
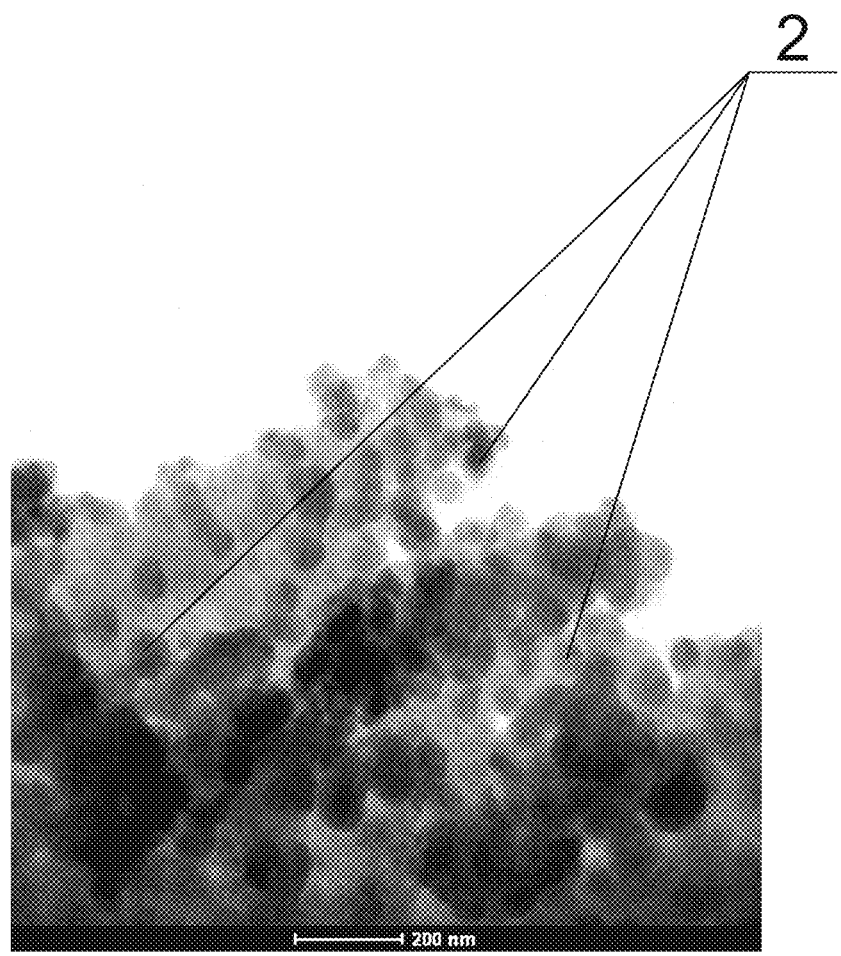
FIG. 2—Transmission electron microscopy (TEM) image of the layer of the carbon matrix with copper grains.

The 100Cr6 shims were coated with the nanocomposite solid lubricant coating, which had the wear rate lower than $10^{-16}$ m$^3$/N·m, the dry friction coefficient of 0.2 and the friction coefficient of 0.08 in an oil environment. FIG. 2 shows the TEM image of a layer of a carbon matrix with copper grains 2, where copper grains 2 are wrapped in the carbon matrix (not visible at this scale) nanolayers.

Example 3

100Cr6 shims were coated by MS PVD method at argon (99.999%) pressure of 2.8 mTorr for 40 minutes at a substrate-target distance of 40-60 mm with a 6.5 micrometers thick nanocomposite solid lubricant coating. The bias voltage of −100V was used during the deposition process. 2 copper-carbon mosaic targets (with 18% carbon surface area) and one molybdenum target were used. The power density of the copper-carbon mosaic target was 115 W/cm$^2$ and the power density of the molybdenum target was 50 W/cm$^2$. The bulk proportions of the elements were in the coating, at. % (excluding oxygen trapped from the environment on the surface of the coating after deposition):

| | |
|---|---|
| carbon | 17; |
| copper | 78; |
| additional metal (molybdenum) | 5. |

The 100Cr6 shims were coated with the nanocomposite solid lubricant coating, which showed the very high dry friction coefficient of 0.7 and the wear rate higher than $10^{-11}$ m$^3$/N·m. Therefore, molybdenum was found unsuitable for the role of the additional metal.

Example 4

100Cr6 shims were coated by MS PVD method at argon (99.999%) pressure of 3.0 mTorr for 70 minutes at a substrate-target distance of 30-40 mm using two copper-carbon mosaic targets (with 18% carbon surface area) and one titanium target. The resulting nanocomposite solid lubricant coating was 14 micrometers thick. The bias voltage of −100V was used during the deposition process. The power density of the copper-carbon mosaic target up to 140 W/cm² was used. Such high power density led to the finer structure of the deposited nanocomposite—the copper grain size was in the range between 20 and 40 nm and the carbon matrix nanolayers had thickness in the range between 1 and 3 nm. The deposited nanocomposite solid lubricant coating contained in bulk proportions, at. % (excluding oxygen trapped from the environment on the surface of the coating after deposition):

| | |
|---|---|
| carbon | 18; |
| copper | 76; |
| additional metal (titanium) | 6. |

The investigation of the cross sectional SEM image of the coating showed that the thickness of each titanium layer was in the range between 5 and 8 nm and the thickness of each copper-carbon layer—in the range between 100 and 130 nm. The 100Cr6 shims were coated with the nanocomposite solid lubricant that had the dry friction coefficient of 0.16 and the friction coefficient of 0.05 in an oil environment.

The present invention proposes MS PVD copper-carbon nanocomposite coatings, which have increased hardness, decreased wear rate and are adapted for application in mechanical engineering as solid lubricant coatings.

Example 5

Pins of engine chains were placed in a vacuum chamber with two-fold rotation with two copper-carbon mosaic targets (with 26% carbon surface area) and two titanium targets. A nanocomposite solid lubricant coating was deposited on the bushes of the engine chains by MS PVD method at argon (99.999%) pressure of 2.8 mTorr for 15 minutes with a substrate-target distance of 60-80 mm. The power density of the copper-carbon mosaic target was 100 W/cm² and the power density of the titanium target was 70 W/cm². The deposited nanocomposite solid lubricant coating had the thickness of 3 micrometers and contained in bulk proportions, at. % (excluding oxygen trapped from the environment on the surface of the coating after deposition):

| | |
|---|---|
| carbon | 17; |
| copper | 57; |
| additional metal (titanium) | 26. |

The pins of the engine chains were coated with the nanocomposite solid lubricant coating with the hardness of 800 HV and the friction coefficient of 0.5 in dry environment. Because of the high friction coefficient, the increase in the lifetime of the chains was negligible and the coatings with the titanium concentration higher than 15 at. % were considered as unsuitable for tribological applications.

Example 6

Bushes of engine chains were placed in a vacuum chamber with two-fold rotation with two copper-carbon mosaic targets (with 26% carbon surface area) and one titanium target. A nanocomposite solid lubricant coating was deposited on the bushes of the engine chains by MS PVD method at argon (99.999%) pressure of 2.8 mTorr for 40 minutes with a substrate-target distance of 60-80 mm. The power density of the copper-carbon mosaic target was 100 W/cm² and the power density of the titanium target was 60 W/cm². The deposited nanocomposite solid lubricant coating had the thickness of 5 micrometers and contained in bulk proportions, at. % (excluding oxygen trapped from the environment on the surface of the coating after deposition):

| | |
|---|---|
| carbon | 23; |
| copper | 67; |
| additional metal (titanium) | 10. |

The bushes of the engine chains were coated with the nanocomposite solid lubricant coating, which showed the hardness of 460 HV, the wear rate lower than $10^{-17}$ m³/N·m, the friction coefficient of 0.09 in an oil environment and it increased the lifetime of the chain by 2.5 times (relative to an uncoated chain).

Example 7

Inner and outer rings of bearings were coated in a vacuum chamber with 3 copper-carbon mosaic targets (with 18% carbon surface area) and one titanium target. A nanocomposite solid lubricant coating was deposited on the bearing rings by MS PVD method with the power density of the copper-carbon mosaic target 120 W/cm² and the power density of the titanium target 60 W/cm² at argon (99.999%) pressure of 3 mTorr for 65 minutes. The deposited nanocomposite solid lubricant coating had the thickness of 15 micrometers and contained in bulk proportions, at. % (excluding oxygen trapped from the environment on the surface of the coating after deposition):

| | |
|---|---|
| carbon | 17; |
| copper | 77; |
| additional metal (titanium) | 6. |

The inner and outer rings of the bearings were coated with the nanocomposite solid lubricant coating, which showed the hardness of 310 HV, the wear rate lower than $10^{-16}$ m³/N·m, the dry friction coefficient of 0.17 and the friction coefficient of 0.06 in an oil environment The present invention proposes MS PVD copper-carbon nanocomposite coatings, which have increased hardness, decreased wear rate and are adapted for application in mechanical engineering as solid lubricant coatings.

What is claimed is:

1. A nanocomposite solid lubricant coating containing a carbon matrix with copper grains characterized in that it contains an additional metal selected from the group consisting of Ti, Zr, Hf, V, in bulk proportions, at. %:

| | |
|---|---|
| carbon | 5-35; |
| copper | 50-90; |
| additional metal | 5-15; | the carbon matrix with copper grains is reinforced with interlayers of the additional metal;
the thickness of each layer of the carbon matrix with copper grains is in the range between 30 and 150 nanometers and the thickness of each interlayer of the additional metal is in the range between 5 and 20 nanometers;
the hardness of said coating is in the range between 200 and 1000 HV.

2. The coating as in claim 1, wherein the copper grain size is in the range between 20 and 100 nanometers, and said copper grains are wrapped in nanolayers of the carbon matrix with thickness in the range between 1 and 10 nanometers.

3. The coating as in claim 1, wherein the thickness of said coating is in the range between 2.5 and 150 micrometers.

4. The coating as in claim 1, wherein the thickness of said coating is in the range between 5 and 15 micrometers.

5. A method of magnetron sputtering physical vapor deposition of the nanocomposite solid lubricant coating as in claim 1, wherein at least one copper-carbon mosaic target and at least one additional metal target are used consecutively with the power density of the copper-carbon mosaic target in the range between 40 $W/cm^2$ and 250 $W/cm^2$.

* * * * *